(12) United States Patent
Pass

(10) Patent No.: US 11,305,378 B2
(45) Date of Patent: *Apr. 19, 2022

(54) WAFER ALIGNMENT WITH RESTRICTED VISUAL ACCESS

(71) Applicant: SunPower Corporation, San Jose, CA (US)

(72) Inventor: Thomas Pass, San Jose, CA (US)

(73) Assignee: SunPower Corporation, San Jose, CA (US)

(*) Notice: Subject to any disclaimer, the term of this patent is extended or adjusted under 35 U.S.C. 154(b) by 81 days.

This patent is subject to a terminal disclaimer.

(21) Appl. No.: 16/773,759

(22) Filed: Jan. 27, 2020

(65) Prior Publication Data

US 2020/0156183 A1 May 21, 2020

Related U.S. Application Data

(62) Division of application No. 15/702,584, filed on Sep. 12, 2017, now Pat. No. 10,543,564, which is a
(Continued)

(51) Int. Cl.
*H01L 31/18* (2006.01)
*H01L 21/68* (2006.01)
(Continued)

(52) U.S. Cl.
CPC ...... *B23K 26/032* (2013.01); *H01L 21/67259* (2013.01); *H01L 21/681* (2013.01);
(Continued)

(58) Field of Classification Search
CPC ..... B23K 26/032; B23K 26/035; H01L 31/14; H01L 21/67259; H01L 31/18;
(Continued)

(56) References Cited

U.S. PATENT DOCUMENTS 6,823,784 B2  11/2004  Kudoh
2002/0186374 A1  12/2002  Little
(Continued)

FOREIGN PATENT DOCUMENTS

JP  2008-192646  8/2008
WO  WO 2013/115851  8/2013

OTHER PUBLICATIONS

International Search Report and Written Opinion from PCT/US2014/070986 dated Apr. 6, 2015, 8 pgs.
(Continued)

*Primary Examiner* — Duy T Nguyen
(74) *Attorney, Agent, or Firm* — Schwabe, Williamson & Wyatt, P.C.

(57) ABSTRACT

Wafer alignment with restricted visual access has been disclosed. In an example, a method of processing a substrate for fabricating a solar cell involves supporting the substrate over a stage. The method involves forming a substantially opaque layer over the substrate. The substantially opaque layer at least partially covers edges of the substrate. The method involves performing fit-up of the substantially opaque layer to the substrate. The method involves illuminating the covered edges of the substrate with light transmitted through the stage, and capturing a first image of the covered edges of the substrate based on the light transmitted through the stage. The method further includes determining a first position of the substrate relative to the stage based on the first image of the covered edges. The substrate may be further processed based on the determined first position of the substrate under the substantially opaque layer.

13 Claims, 6 Drawing Sheets

Related U.S. Application Data division of application No. 14/135,147, filed on Dec. 19, 2013, now Pat. No. 9,796,045.

(51) Int. Cl.
  *H01L 21/67* (2006.01)
  *H01L 31/14* (2006.01)
  *B23K 26/03* (2006.01)
  *G03F 9/00* (2006.01)
  *H01L 31/0224* (2006.01)

(52) U.S. Cl.
  CPC .............. *H01L 31/14* (2013.01); *H01L 31/18* (2013.01); *G03F 9/7084* (2013.01); *G03F 9/7088* (2013.01); *H01L 31/022491* (2013.01)

(58) Field of Classification Search
  CPC .......... H01L 21/681; H01L 31/022491; H01L 21/682; H01L 31/0392; G03F 9/7088; G03F 9/7084; Y02E 10/50
  USPC ............................................................ 438/7
  See application file for complete search history.

(56) References Cited

U.S. PATENT DOCUMENTS

| | | | |
|---|---|---|---|
| 2003/0053059 A1 | 3/2003 | Mishima et al. | |
| 2008/0181752 A1* | 7/2008 | Takahashi | H01L 21/681 414/222.02 |
| 2009/0323036 A1 | 12/2009 | Hidaka et al. | |
| 2010/0045847 A1 | 2/2010 | Ryu | |
| 2010/0065757 A1 | 3/2010 | Schwab et al. | |
| 2010/0279439 A1 | 11/2010 | Shah et al. | |
| 2011/0090476 A1* | 4/2011 | Van De Kerkhof | G03F 9/7088 355/53 |
| 2012/0009051 A1 | 1/2012 | Ruth et al. | |
| 2012/0268585 A1 | 10/2012 | Markwort et al. | |
| 2013/0102103 A1 | 4/2013 | Cellere et al. | |

OTHER PUBLICATIONS

International Preliminary Report on Patentability from PCT/US2014/070986 dated Jun. 30, 2016, 7 pgs.
Office Action from Korean Patent Application No. 10-2016-7015735 dated May 17, 2021, 5 pgs.
First Action Interview Pre-Interview Communication from U.S. Appl. No. 14/135,147 dated May 15, 2015, 2 pgs.
Non-final Office Action from U.S. Appl. No. 14/135,147 dated Jun. 1, 2016, 12 pgs.
Final Office Action from U.S. Appl. No. 14/135,147 dated Dec. 13, 2016, 9 pgs.
First Office Action from Chinese Patent Application No. 2014800687746 dated May 3, 2017, 9 pgs.
Notice of Second Office Action from Chinese Patent Application No. 2014800687746 dated Dec. 6, 2017, 6 pgs.
Report of the Rejection Decision from Chinese Patent Application No. 2014800687746 dated Sep. 27, 2018; 5 pgs.
First Action Interview Pre-Interview Communication from U.S. Appl. No. 15/702,584 dated Mar. 1, 2019, 4 pgs.
First Action Interview Office Action from U.S, U.S. Appl. No. 15/702,584 dated May 22, 2019, 3 pgs.

* cited by examiner

WAFER ALIGNMENT WITH RESTRICTED VISUAL ACCESS

CROSS-REFERENCE TO RELATED APPLICATIONS

This application is a divisional of U.S. patent application Ser. No. 15/702,584, filed on Sep. 12, 2017, which is a divisional of U.S. patent application Ser. No. 14/135,147, filed on Dec. 19, 2013, now U.S. Pat. No. 9,796,045, issued Oct. 24, 2017, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Techniques for increasing the efficiency in the manufacture of solar cells are generally desirable. Some embodiments of the present disclosure allow for increased solar cell manufacturing efficiency by providing novel processes for fabricating solar cell structures.

DETAILED DESCRIPTION

Figure 1:
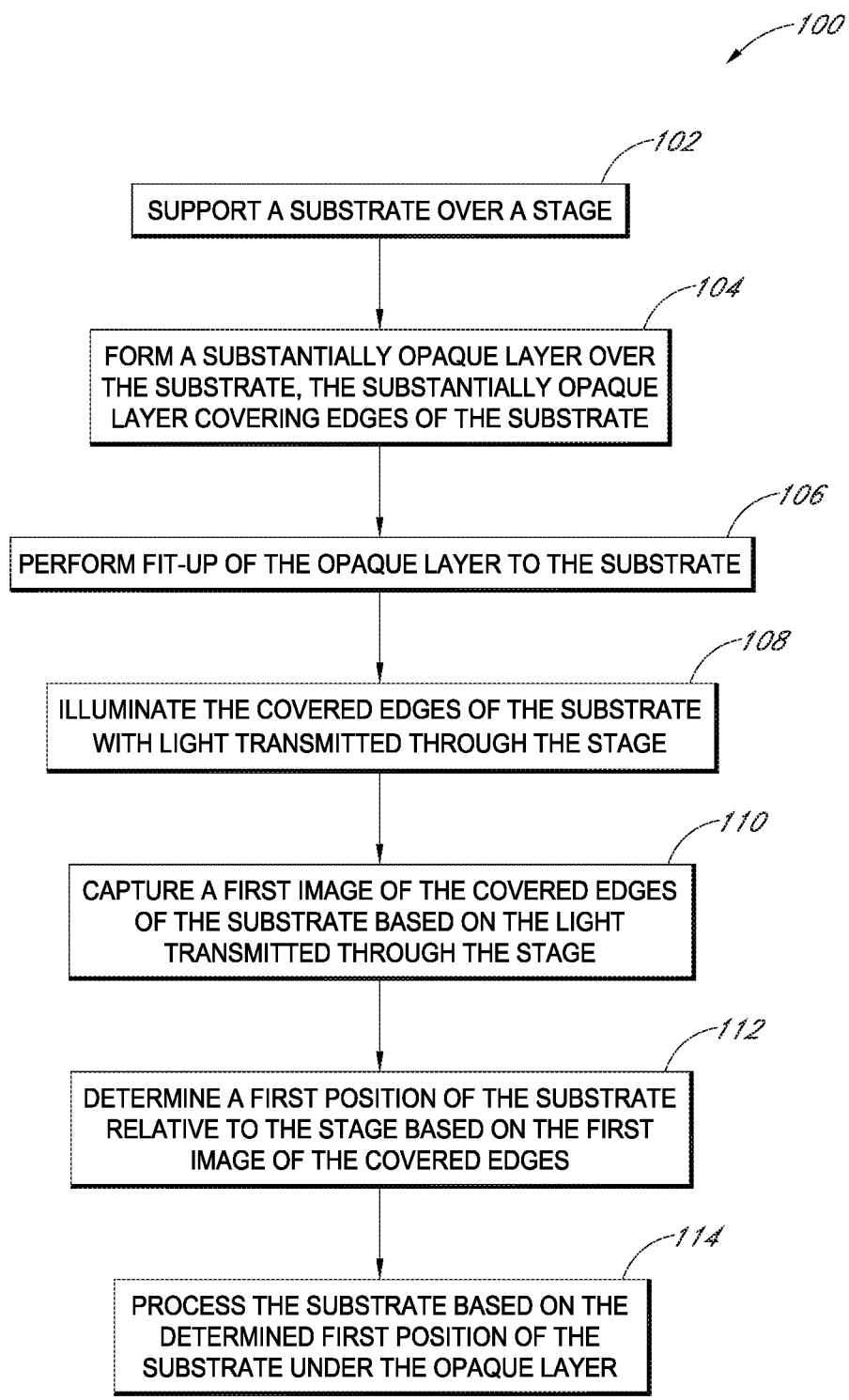
FIG. 1 is a flowchart illustrating operations in a method of processing a substrate for fabricating a solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods and systems for wafer alignment with restricted visual access are described herein. Although much of the specification is described in terms of photovoltaic wafers, the disclosure applies equally to other semiconductor wafers. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as laser processing techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of processing a substrate for fabricating a solar cell. In an embodiment, a method involves supporting the substrate over a stage. The method involves forming a substantially opaque layer over the substrate. The substantially opaque layer at least partially covers edges of the substrate. The method involves performing fit-up of the substantially opaque layer to the substrate. The method involves illuminating the covered edges of the substrate with light transmitted through the stage, and capturing a first image of the covered edges of the substrate based on the light transmitted through the stage. The method involves determining a first position of the substrate relative to the stage based on the first image of the covered edges. The method further involves processing the substrate based on the determined first position of the substrate under the substantially opaque layer.

Also disclosed herein are systems for processing a substrate for fabrication of a solar cell. In one embodiment, the system includes a stage configured to support the substrate. A layer formation station is configured to form a substantially opaque layer over the substrate and to fit-up the substantially opaque layer to the substrate. The substantially opaque layer at least partially covers edges of the substrate. The system includes a light source configured to illuminate the covered edges of the substrate through the stage. The system includes an image sensor configured to capture a first image of the covered edges of the substrate based on the light transmitted through the stage. A computing device is configured to determine a position of the substrate relative to the stage based on the first image of the covered edges. The system also includes a processing station configured to process the substrate based on the determined position of the substrate under the substantially opaque layer.

Thus, embodiments of the present disclosure enable visual alignment of a substrate to a stage when one or more edges of the substrate are obscured.

FIG. 1 is a flowchart 100 illustrating operations in a method of processing a substrate for fabricating a solar cell, in accordance with an embodiment of the present disclosure. FIGS. 2A-2D illustrate cross-sectional views of processing operations corresponding to operations of the flowchart 100 of FIG. 1, and in accordance with an embodiment of the present disclosure.

Figure 2A:
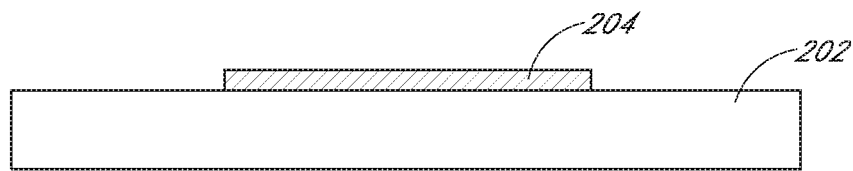
FIGS. 2A-2D illustrate cross-sectional views of processing operations in a method of processing a substrate corresponding to operations of the flowchart of FIG. 1, and in accordance with an embodiment of the present disclosure.

Turning to FIG. 2A and to corresponding operation 102 of FIG. 1, a substrate 204 is supported over a stage 202. According to embodiments, the stage 202 can be substantially transparent. A stage is substantially transparent if the stage transmits light or other electromagnetic radiation at wavelengths used by an image sensor configured to capture an image of the substrate 204 through the stage 202. In one embodiment, the stage 202 transmits light in the visible and/or infrared spectrums. In other embodiments, the stage 202 may transmit light at wavelengths other than the visible and infrared spectrums. Substantially transparent stages may include glass, epoxy, plastic, or other transparent materials. In other embodiments, the stage 202 can be substantially opaque or partially transparent, but have substantially transparent windows, as described below in reference to FIGS. 4A and 4B.

A stage is substantially opaque or partially transparent if the stage does not transmit sufficient light or other electromagnetic energy to capture an accurate image of the substrate 204 through the stage 202. Substantially opaque stages may include ceramic, opaque aluminum, anodized aluminum, or other opaque materials. Partially transparent stages may include, for example, the materials discussed above with respect to substantially transparent stages (e.g., glass, epoxy, plastic, or other transparent materials), but may have properties (e.g., composition and/or structure) resulting in the material not transmitting sufficient light to capture an accurate image of the substrate 204 through the stage 202.

The stage 202 may be a single, monolithic piece, or may include multiple pieces. For example, in one embodiment, the stage 202 is a solid piece of aluminum, glass, or other material capable of supporting the substrate 204. In another example, the stage 202 includes a plate embedded in another material. In one such embodiment, the stage 202 may include a thin aluminum plate embedded in an epoxy base. In one such embodiment, the epoxy base may further include embedded light sources (e.g., LED light sources for backlighting).

The composition and thickness of the stage 202 and/or windows in the stage 202 may depend on, for example, the type of processing to be performed on the substrate 204 supported over the stage 202. According to embodiments, the stage 202 and/or windows in the stage 202 have a thickness and composition such that they do not deflect under pressure exerted by processing of the substrate 204. For example, in one embodiment, the stage 202 has a thickness to minimize deflection during fit-up (e.g., during operation 106 of the flowchart 100 of FIG. 1). The thickness and composition of the stage 202 and/or windows in the stage 202 may also be selected to minimize degradation of the stage 202 as a result of processing the substrate 204. Processing requiring very flat surfaces that are resistant to wear may use a relatively hard material for the stage, such as glass. Other processing operations may use a stage including softer materials, such as epoxy.

The thickness and composition of the stage may also depend on, for example, the properties of a base supporting the stage 202. For example, if the entire perimeter of the stage 202 is supported by a base, the stage 202 may be relatively thin. In contrast, if the entire perimeter of the stage 202 is not supported by a base, the stage 202 may be thicker. For example, in screen printing, the entire perimeter of the stage 202 may be supported by a base, and therefore the stage 202 may be relatively thin (e.g., approximately ½ inch). In another example, in laser processing, the stage may be disposed over a center post that does not fully support the stage 202, and therefore may be thicker (e.g., ¾ inch to 1 inch). In some embodiments, some or all areas of the stage 202 are thinner than existing stages. For example, in one embodiment, the entire stage has a thickness in a range of ½ to 1 inch. In other embodiments, the stage 202 may have a thickness that is less than ½ inch or greater than 1 inch, and may depend on the features described above. In other embodiments, the stage 202 may include windows that are thinner than the surrounding stage. For example, the stage 202 may have a thickness in a range of ½ to 1 inch, and windows in the stage may have a thickness in a range of 1 to 12 mm. A thin stage or thin windows in a stage can enable improved clarity of images of the substrate 204 captured through the stage 202.

In one embodiment, the stage 202 may include one or more lenses to improve imaging. Lenses may enable the use of stages and/or windows that (without the aid of the lenses) lack optical properties for capturing sufficiently clear images of the covered edges through the stage 202 and/or windows. For example, in one embodiment, the stage 202 and/or windows in the stage 202 may be hard and flat to enable a particular type of substrate processing, and the stage may include lenses between the stage 202 and the image sensors 212 to improve the clarity of captured images.

According to an embodiment, the stage includes a vacuum chamber with one or more zones. In one such embodiment, the zones are independently controllable (e.g., the zones may be independently activated or deactivated). For example, a processing system or tool with multiple different processing stations (e.g., the system in FIG. 5 configured as a rotary table 502) may activate or deactivate zones of the vacuum chamber according to the current processing station. For example, in an embodiment with a stage that includes three vacuum zones, none (zero), some (one or two), or all (three) of the vacuum zones may be activated at a given station. Other embodiments may include fewer than or more than three vacuum zones. Examples of activating or deactivating zones of a vacuum chamber of a stage are described in more detail below with respect to FIG. 5.

Figure 2B:
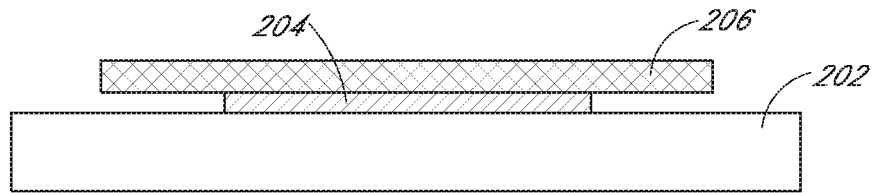

Returning to FIG. 1 and to corresponding FIG. 2B, the method includes forming a substantially opaque layer 206 over the substrate 204 at operation 104. A layer is substantially opaque if the layer prevents an image sensor located above the layer from identifying characteristics (e.g., edges, dimensions, particular features, etc.) of the substrate below the layer. Forming the substantially opaque layer 206 over the substrate may involve forming a metal layer over the substrate 204. In one embodiment where the substantially opaque layer 206 is a metal layer, the substantially opaque layer 206 may be aluminum (e.g., aluminum sheet/foil), copper, silver, composites, or any other metal appropriate for forming conductive contacts for solar cells. Forming a metal layer over the substrate 204 may involve placing a metal sheet over the substrate, or any other method of forming a metal layer resulting in covered or otherwise visually obscured (from above) substrate edges. For example, in one embodiment, forming a metal layer over the substrate 204 may involve placing a metal sheet/foil with a carrier (e.g., a plastic carrier such as a polyethylene terephthalate (PET) carrier).

In one such embodiment, forming the substantially opaque layer 206 over the substrate 204 may involve forming a second metal layer (e.g., a metal sheet) over a first metal layer of the substrate 204. For example, a photovoltaic wafer can be placed on the stage 202 with a first metal layer up, and a second metal layer (e.g., the substantially opaque layer 206) can be formed on the first metal layer of the photovoltaic wafer. In one embodiment, the metal layer(s) are further processed to form contacts for solar cells. Other embodiments may include forming a substantially opaque non-metal layer (e.g., a conductive carbon layer, or other substantially opaque non-metal layer).

According to an embodiment, the substantially opaque layer 206 at least partially covers edges of the substrate. "Edges of the substrate" include one or more sections of the perimeter of the substrate. For example, "edges of the substrate" may include one or more of the edges and/or corners of a substantially square or rectangular substrate, as well as one or more areas of the perimeter of a non-rectangular substrate, such as a round substrate.

Figure 2C:
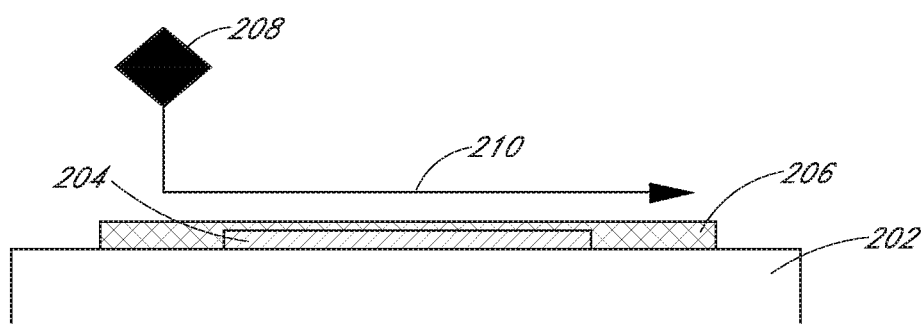

At operation 106 and corresponding to FIG. 2C, the method includes performing fit-up of the substantially opaque layer 206 to the substrate 204. Fit-up involves mechanically closing a gap between two layers such as by the application of pressure to the layers with a roller, scraper (e.g., squeegee), pressure plate, vacuum pressure, or other means of reducing a gap between two layers. The fit-up mechanism used may depend on properties of the substantially opaque layer 206 and/or the surface of the substrate 204. For example, in an embodiment where the substantially opaque layer 206 is a soft (e.g., ductile) film, performing fit-up may involve the use of vacuum pressure to reduce the gap between the layers. In another example, in an embodiment where the substantially opaque layer 206 is a hard film, fit-up may involve application of pressure with a mechanical applicator such as a roller, scraper, or pressure plate.

According to an embodiment, performing fit-up may also involve wrapping (e.g., deforming) the substantially opaque layer 206 around the edges of the substrate 204. Wrapping the substantially opaque layer 206 around the edges of the substrate 204 may be intentional, or an unintentional consequence of performing fit-up to reduce the gap between the layers. In other embodiments, the substantially opaque layer 206 does not wrap around the edges of the substrate. In embodiments where the substantially opaque layer 206 wraps around edges of the substrate 204, the extent and consistency of the wrapping may depend on the properties of the substantially opaque layer 206 and the fit-up mechanism used. For example, in an embodiment where the substantially opaque layer 206 is a soft film such as metal sheet/foil, the substantially opaque layer 206 may be wrapped with relatively high consistency and proximity to the edges of the substrate 204. In an embodiment where the substantially opaque layer 206 is stiff and/or thick, the substantially opaque layer 206 may be wrapped around the edges with less consistency and lower proximity to the edges of the substrate 204.

FIG. 2C illustrates a squeegee 208 that drops down and sweeps across the substantially opaque layer 206, as indicated by the arrow 210. In one embodiment, the squeegee 208 (or other mechanism to apply pressure to the opaque layer 206) sweeps across the opaque layer 206 multiple times. In one embodiment, the resulting gap between the substantially opaque layer 206 and the substrate 204 after fit-up is on the order of microns. However, the size of the gap after fit-up may depend on the properties of the substantially opaque layer 206 and surface of the substrate 204, as well as the mechanism used to perform fit-up.

In one embodiment, the stage 202 is substantially flat and remains flat during fit-up. A substantially flat stage can prevent breakage of the substrate 204, prevent damage to the front-side of the substrate 204, and result in a planar surface for the fit-up operation. Therefore, in an embodiment where the stage 202 has one or more holes to generate a vacuum between the substrate 204 and the stage 202, the holes are sufficiently small to maintain a substantially flat stage.

As explained above, performing fit-up of the substantially opaque layer 206 to the substrate 204 reduces the gap between the substantially opaque layer 206 and the substrate 204. As a result of fitting-up the substantially opaque layer 206 to the substrate 204, the position of the substrate may move relative to the stage 202. Performance of subsequent processing operations on the substrate 204 may benefit from or may require precise identification of the location of the substrate 204 relative to the stage 202. Therefore, subsequent to an operation that may result in displacement of the substrate 204 (such as the fit-up operation 106 of FIG. 1) and prior to such additional processing, embodiments may involve identifying the location of the substrate 204 relative to the stage 202 and/or relative to other elements of a system for processing the substrate 204. After identifying the location of the substrate 204, adjustments may then be made in the system for processing the substrate 204 to compensate for any movement of the substrate 204.

The process of identifying the location of the substrate 204 and/or making adjustments to the substrate location or to other system components or parameters based on the identified location of the substrate is referred to herein as "alignment." Existing alignment methods may include identifying the location of the substrate 204 relative to the stage 202 using an overhead camera (e.g., a camera positioned above the stage 202 such that the substantially opaque layer 206 is in between the camera and the substrate 204 and stage 202). However, with the substantially opaque layer 206 blocking one or more of the edges of the substrate 204 from overhead visual recognition, existing methods can be ineffective at identifying the location of the substrate 204.

As discussed above, in embodiments where forming the substantially opaque layer 206 involves placing a metal sheet, fit-up of the metal sheet to the substrate 204 may result in the metal sheet wrapping around the substrate edges. Although the approximate location of some or all of the substrate edges may be visible overhead due to the substantially opaque layer 206 wrapping around the edges of the substrate, the substantially opaque layer 206 typically does not wrap around the edges with high uniformity. Therefore, overhead visual alignment systems still generally lack sufficient precision and are ineffective despite being able to see the approximate location of the substrate edges in some embodiments. For example, in processes requiring fine pitch alignment (e.g., less than 1 mm with placement tolerances of less than 100 µm), such overhead alignment systems may be ineffective. Additionally, mechanisms for forming and/or performing fit-up of the substantially opaque layer 206 to the substrate 204 are typically located over the substrate 204. Therefore, the location of layer formation and/or fit-up mechanisms can interfere with or block overhead visual alignment systems.

In various embodiments, alignment may be performed prior to forming the substantially opaque layer 206, however, as described above, performing fit-up of the substantially opaque layer 206 can be a mechanically active process. Such mechanically active processes may result in displacement of the substrate 204 on the stage 202, which can negate pre-fit-up alignment operations.

Furthermore, processing a substrate for fabricating a solar cell may involve moving the substrate from one location to another location on a processing tool or system. Movement of the substrate 204 on a processing tool can enable multiple processes to be carried out on the same substrate on a given tool, which can potentially improve the overall equipment effectiveness (OEE) of the tool. An exemplary layout of a processing tool with different processing stations is the rotary table 502 illustrated in FIG. 5. As explained below in more detail, a rotary table rotates a stage amongst processing stations. Another processing tool configuration that enables movement of a substrate amongst processing stations is a linear slide, which moves a substrate linearly amongst processing stations. Existing processing tools that move a substrate within the tool typically include transport components that are high precision and high cost.

In contrast to existing methods, embodiments of the present disclosure enable identifying the location of the substrate 204 relative to the stage 202 when edges of the substrate 204 are covered by the substantially opaque layer 206. According to the embodiment illustrated in FIG. 1, and corresponding to FIG. 2D, the method further involves illuminating the covered edges of the substrate 204 with light transmitted through the stage 202 at operation 108. According to an embodiment, illuminating the covered edges of the substrate 204 includes creating contrast between the edges of the substrate 204 and the background (e.g., the substantially opaque layer 206) that is sufficient to identify the location of the edges of the substrate 204. Creating sufficient contrast between the edges of the substrate 204 and the background can be challenging due to the close proximity of the substantially opaque layer 206 to the substrate 204. In one embodiment, one or more light sources 214 may emit radiation capable of transmission through one or more areas of the stage 202 to illuminate the covered edges of the substrate 204. The one or more light sources 214 may be located anywhere that enables the light source(s) to sufficiently illuminate the substrate 204 to capture an image of the covered edges of the substrate 204. For example, one embodiment involves illuminating the covered edges of the substrate with one or more light sources located in the stage. One or more light sources may alternatively (or additionally) be located below and/or next to the stage. Bright field or dark field light sources may be used, as is explained below in more detail.

Figure 2D:
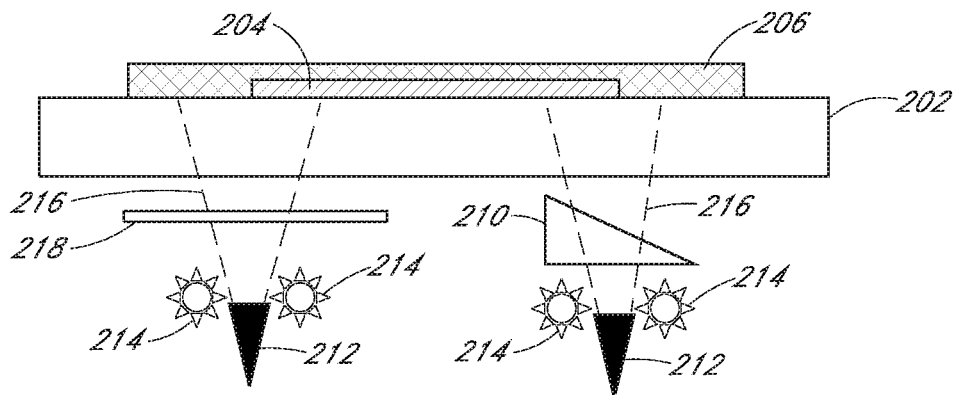

The method further involves capturing an image of the covered edges of the substrate 204 based on the light transmitted through the stage 202, at operation 110 and also corresponding to FIG. 2D. For example, one or more image sensors 212 capture one or more images of the covered edges of the substrate 204. The illustrated embodiment includes a plurality of image sensors 212 located below the stage 202 that are configured to capture the image(s) of the covered edges of the substrate 204. The image sensors 212 have a field of view (FOV) 216 that enables capturing an image of the edges of the substrate 204 during processing. Thus, according to an embodiment, the image sensors 212 are located at a distance from the stage 202 to obtain a FOV and resolution enabling identification of the edges of the substrate 204. In one such embodiment, the image sensors 212 are located ¼ to ¾ inch from the stage 202. Other embodiments may use sensors located closer to the stage than ¼ inch, or further from the stage than ¾ inch. According to embodiments, the FOV 216 of the image sensors 212 may also enable capturing images of fiducial(s). A fiducial is something (e.g., a marker) in, on, or near the stage 202, the substrate 204, or the substantially opaque layer 206 that may be used as a point of reference to determine location, dimensions, or other features.

FIG. 2D illustrates two image sensors 212, but other embodiments may capture images with one image sensor, or with more than two image sensors. For example, in one embodiment, the method involves capturing images with eight image sensors (e.g., two image sensors positioned to capture images of each edge of a rectangular substrate). In one embodiment, a plurality of image sensors may enable the location of the substrate 204 to be determined with greater accuracy than a single image sensor.

As discussed above, in some embodiments, the substantially opaque layer 206 may wrap or deform around the edges of the substrate 204. In one such embodiment, the degree of deformation, consistency of deformation on the edges or corners of the substrate 204, and proximity of the substantially opaque layer 206 to the edges or corners of the substrate 204 can have a significant impact on the contrast created by the light sources 214, and on the effectiveness of imaging through the stage 202. Therefore, whether and how the substantially opaque layer 206 wraps around the edges of the substrate may impact the type and configuration of the stage 202, light sources 214, and image sensors 212.

As mentioned above, in one embodiment, the stage is substantially transparent. In one such embodiment, capturing the image of the covered edges of the substrate involves capturing the first image through the substantially transparent stage. In another embodiment, the stage 202 is substantially opaque or partially transparent, but includes one or more substantially transparent windows (e.g., the stage 402 of FIG. 4B, discussed below). In one such embodiment, capturing the image of the covered edges of the substrate 204 involves capturing the first image through the one or more substantially transparent windows in the stage 202. In an embodiment where the stage 202 includes a vacuum chamber, the features of the vacuum chamber (e.g., one or more holes for generating a vacuum) are located and/or sized such that the features do not interfere with capturing an image of the covered edges of the substrate 204.

The method may involve capturing images of the entire substrate perimeter, or less than the entire substrate perimeter. For example, the method may involve capturing an image of each of the covered edges of the substrate 204 (e.g., for a substantially square or rectangular substrate). In another example, the method may involve capturing an image of each corner of the substrate 204. Other embodiments may include capturing images of one, two, or more than two edges and/or corners. In an embodiment with substantially transparent windows in the stage 202, the windows may be located to enable capturing the desired edges of the substrate 204.

Capturing an image of the covered edges of the substrate 204 may involve capturing images with a camera, a dark field imaging system, or any other image sensor. In an embodiment using a dark field imaging system, the system illuminates the substrate 204 with dark field illumination. In one embodiment, light sources for dark field illumination are located in or next to the stage 202. In one embodiment using dark field illumination, the illumination can be piped internal to the stage 202 for dark field like operation. In an embodiment using a camera, bright field illumination may be used.

After capturing the image of the covered edges, the method involves determining a position of the substrate 204 relative to the stage 202 based on the image, at operation 112. In embodiments, a computing device may use an edge and/or corner recognition technique to recognize the substrate edges through the stage 202 and against a background of the substantially opaque layer 206. The computing device may further determine the location of the substrate 204 based on edges or corners recognized in the captured images. For example, a computing device may perform center of mass computations using the determined location of edges of the substrate 204, or any other alignment method.

According to an embodiment, the method further involves processing the substrate 204 based on the determined position of the substrate 204, at operation 114. Processing the substrate based on the determined position can include, for example, applying a laser to the substantially opaque layer 206 and/or the substrate 204. In one such example where the substantially opaque layer 206 is a second metal layer formed over a first metal layer of the substrate 204, applying a laser involves laser welding the first and second metal layers. Application of a laser may also (or alternatively) involve trimming the substantially opaque layer 206, patterning the substantially opaque layer 206, and/or patterning the substrate 204. The position, wavelength, duration, and/or power of the laser(s) and/or the position of the stage 202 used for such laser processing operations may be adjusted by a computing device (e.g., controller) based on the determined position of the substrate 204. Other embodiments may include other processing operations based on the determined position of the substrate 204.

In one embodiment, the method involves protecting the image sensors 212 from processing (e.g., laser processing). For example, prior to processing the substrate 204, the method may involve protecting the image sensors 212 with a shutter 218 between the stage 202 and the image sensors 212. Protecting the image sensors 212 with the shutter 218 may involve closing the shutter prior to laser processing operations, and opening the shutter prior to alignment operations. In another example, the method may involve the use of a half-silvered mirror 216 positioned between the stage and the image sensor to protect the image sensor.

Capturing an image of the covered edges of the substrate 204 and determining the position of the substrate 204 relative to the stage 202 at operations 110 and 112 may be performed one or more times during processing of the substrate 204 for fabricating a solar cell. Embodiments may include capturing an image of the covered edges and determining the position of the substrate relative to the stage: after formation of the substantially opaque layer 206, after fit-up of the substantially opaque layer 206 to the substrate 204, after laser welding the substantially opaque layer 206 and the substrate 204, after patterning the opaque layer 206 and/or the substrate 204, after trimming the substantially opaque layer 206, and/or at any other time when it may be desirable to ascertain the location of the substrate 204.

For example, the location of the substrate 204 relative to the stage 202 may first be determined after fit-up of the substantially opaque layer 206 to the substrate 204, and prior to processing the substrate 204 with a laser (e.g., laser welding and/or patterning). The location of the substrate 204 relative to the stage 202 may be determined a second time after processing the substrate 204 with a laser. In one such embodiment, the method involves capturing a second image of the covered edges of the substrate 204 after applying the laser, and determining a second position of the substrate 204 relative to the stage 202 based on the second image of the covered edges. The method may then involve further processing of the substrate 204. For example, after determining the second position, the method may include further processing such as trimming the patterned substantially opaque layer.

Thus, the exemplary method of FIG. 1 can enable alignment of a substrate after formation of a substantially opaque layer that at least partially covers or obscures edges of the substrate. Therefore, embodiments may also enable processing tools that move the substrate within the tool without requiring high precision transport components.

Figure 3A:
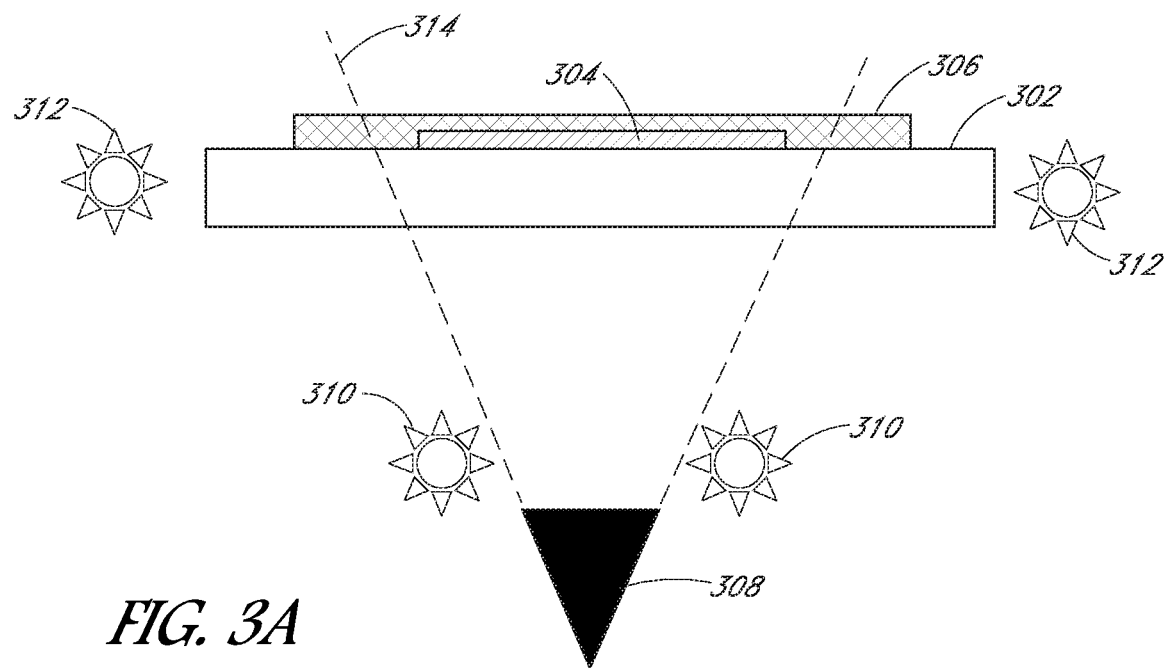
FIGS. 3A and 3B illustrate cross-sectional views of alignment operations in a method of processing a substrate, in accordance with embodiments of the present disclosure.
Figure 3B:
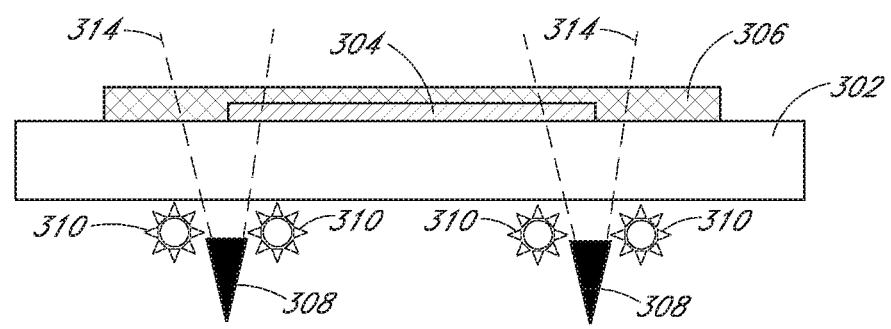

FIGS. 3A and 3B illustrate cross-sectional views of alignment operations in a method of processing a substrate, in accordance with embodiments of the present disclosure. FIGS. 3A and 3B both illustrate a stage over which a substrate 304 is disposed. A substantially opaque layer 306 is disposed over the substrate 304. The stage 302, substrate 304, and substantially opaque layer 306 may be similar to, or the same as, in FIGS. 2A-2D. FIG. 3A illustrates a system with light sources 310 located below the stage and light sources 312 located next to or adjacent to the sides of the stage 302. FIG. 3B illustrates a system with light sources 310 below the stage 302, but no light sources next to the stage 302. As discussed above, light sources may also (or alternatively) be located in the stage (not shown).

FIG. 3A illustrates a system with a single image sensor 308 with a field of view 314 that encompasses all the edges of the substrate 304. In contrast, FIG. 3B illustrates a system with multiple image sensors 308, each of which have field of views 314 that capture less than all the edges of the substrate 304. As illustrated in FIG. 3B, one image sensor captures one edge of the substrate, while another image sensor captures an opposite edge of the substrate. In one embodiment with multiple image sensors, and as illustrated in FIG. 3B, light sources 310 are located near each of the image sensors 308. FIG. 3A also illustrates light sources 310 located near the image sensor 308. FIG. 3A further illustrates light sources next to the stage 302, which may be beneficial for dark field imaging. Other embodiments may use common illumination for more than one or all of the image sensors 308.

FIGS. 3A and 3B illustrate two examples of configurations of light sources and image sensors. Other embodiments may include other configurations of light sources and image sensors as discussed above with respect to FIG. 2D. In one example, a system may include four to eight image sensors located such that one to two image sensors can capture images of each edge of a rectangular substrate.

Figure 4A:
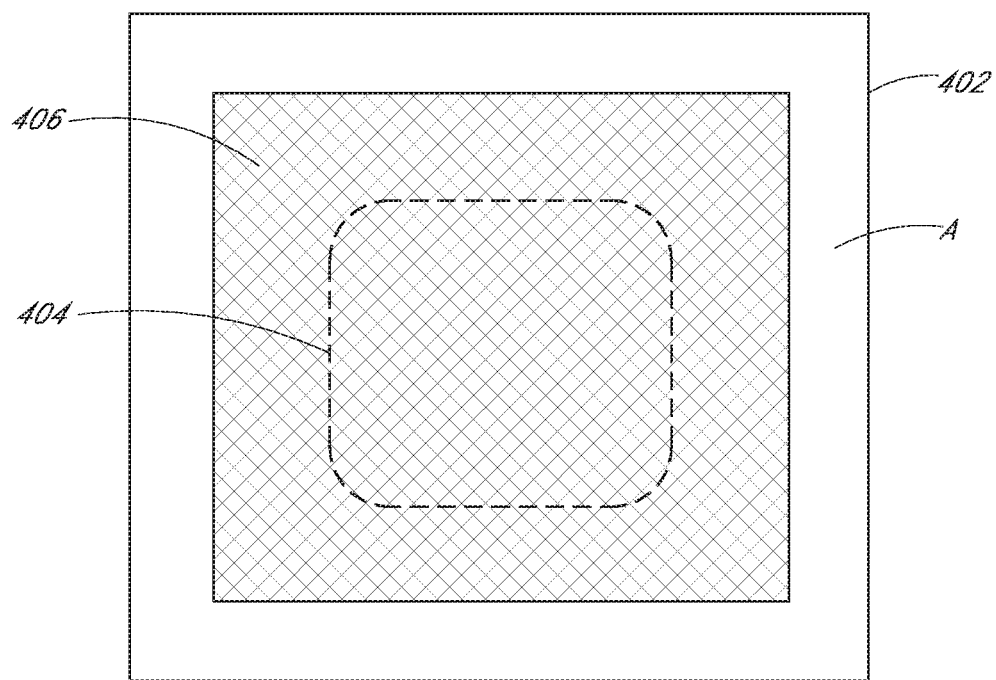
FIGS. 4A and 4B illustrate top and bottom plan views, respectively, of a stage in a system for processing a substrate for fabrication of a solar cell, in accordance with an embodiment of the present disclosure.
Figure 4B:
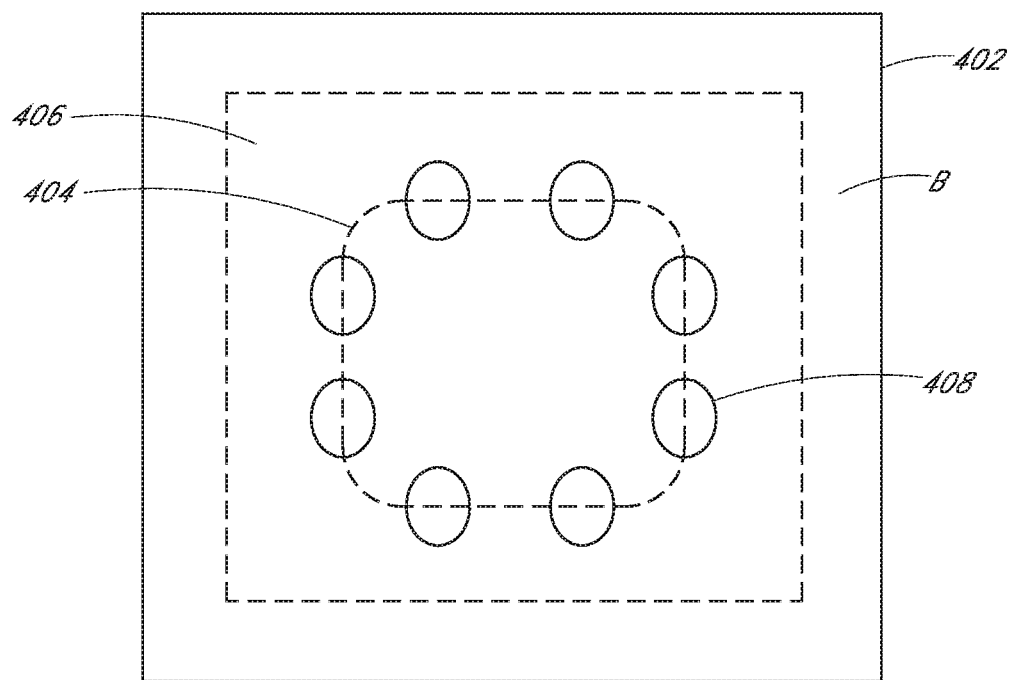

FIGS. 4A and 4B illustrate top and bottom plan views of a stage 402 in a system for processing a substrate for fabrication of a solar cell, in accordance with an embodiment of the present disclosure. FIG. 4A illustrates a top side A of the stage 402. The stage 402 supports a substrate 404. Edges of the substrate 404 are at least partially covered by a substantially opaque layer 406. Although FIG. 4A shows the substantially opaque layer 406 covering all the edges of the substrate 404, embodiments described herein may also apply when less than all the edges of the substrate 404 are covered. As explained above, existing methods using overhead cameras to perform alignment can be ineffective at determining the location of the substrate 404 relative to the stage 402 after formation of the substantially opaque layer 406.

FIG. 4B illustrates a bottom side B of the stage 402. In one embodiment, the stage 402 is substantially transparent. Therefore, an image sensor can capture an image of edges of a substrate 404 covered by the substantially opaque layer 406 through potentially any area of the stage 402. In other embodiments, the stage 402 is substantially opaque, or partially transparent such that an image sensor cannot capture an image of the covered edges of the substrate 404 sufficient to accurately identify the location of the substrate 404.

In one such embodiment, and as illustrated in FIG. 4B, the substantially opaque or partially transparent stage includes one or more windows 408 through which one or more image sensors can capture images of the covered edges of the substrate 404. Although the above examples refer to windows in stages that are substantially opaque or partially transparent, stages that are substantially transparent may also include windows. Windows in substantially transparent stages may have different optical properties than the stage to enable improved image capturing. For example, the stage may include windows that allow transmission of more light than the stage 402, and/or magnify the covered edges of the substrate 404. In one embodiment, the windows 408 are thinner than the surrounding areas of the stage 402 to enable improved image capture. FIG. 4B illustrates elliptical windows 408 in the stage 402, but other embodiments may include windows having other shapes and/or sizes.

Returning to the embodiment illustrated in FIG. 4B, the stage 402 includes the windows 408 in areas of the stage 402 where edges of the substrate 404 are expected to be located during processing. FIG. 4B shows two windows along each edge of the substrate 404. Other embodiments may include one window along each edge of the substrate, more than two windows along each edge of the substrate 404, windows along less than all the edges of the substrate, windows at one or more corners of the substrate, or any other configuration of windows enabling capture of edges of the covered substrate 404.

Figure 5:
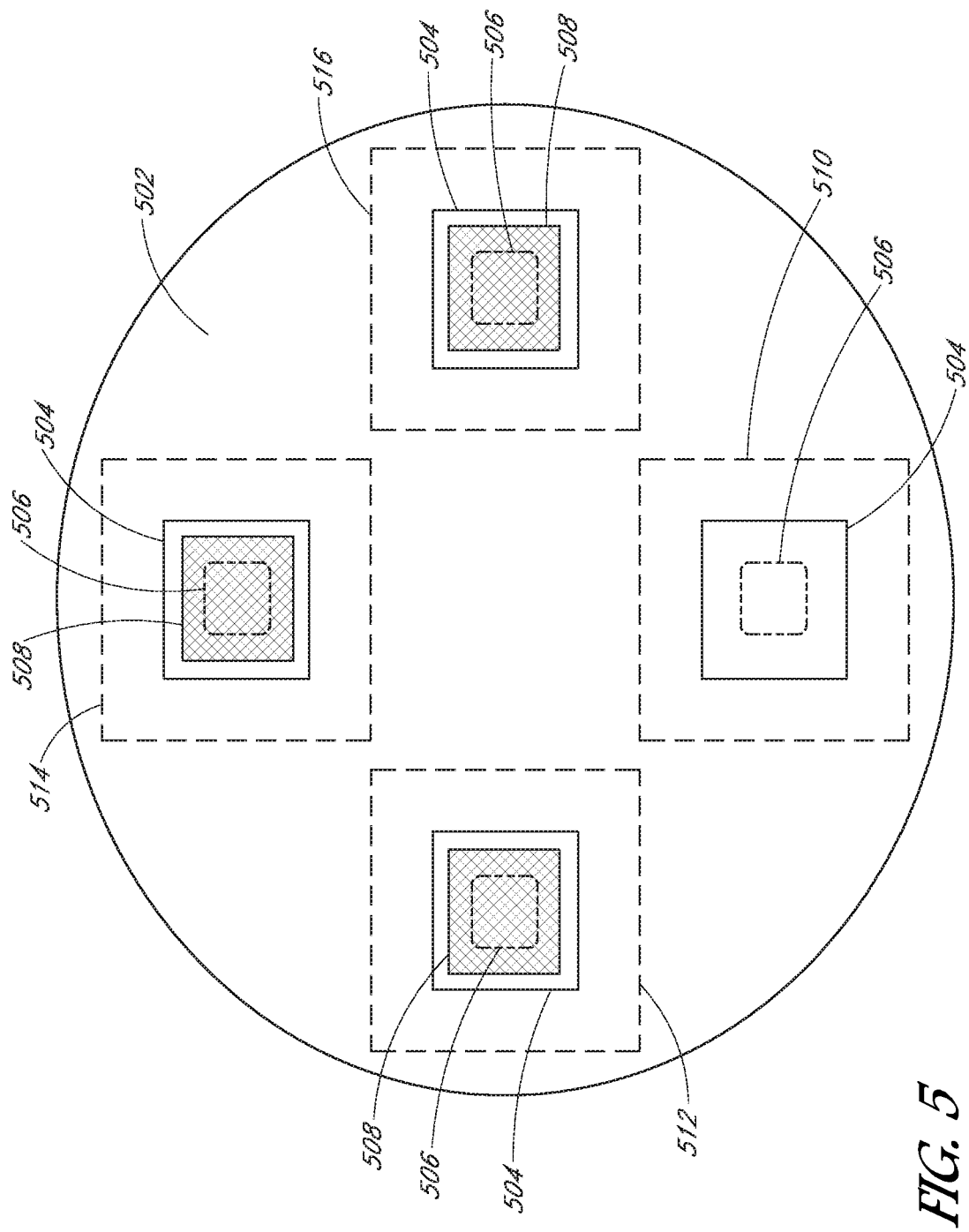
FIG. 5 illustrates a plan view of a system for processing a substrate for fabrication of a solar cell, in accordance with an embodiment of the present disclosure.

FIG. 5 illustrates a plan view of an example system for processing a substrate for fabrication of a solar cell, in accordance with an embodiment of the present disclosure. The example system illustrated in FIG. 5 includes a rotary table 502 and a stage 504. The stage 504 is configured to support a wafer or substrate 506. The rotary table 502 includes a translational mechanism configured to rotate the stage 504 amongst processing stations 510, 512, 514, and 516. The embodiment illustrated in FIG. 5 depicts four processing stations: a loading station 510, a layer formation station 512, a laser station 514, and a patterning and trimming station 516. Other embodiments may include different processing stations than those depicted in FIG. 5. In the illustrated embodiment, the system loads the substrate 506 onto the stage 504 at a loading station 510. As discussed above, the stage 504 may have a vacuum chamber with one or more zones. In one such embodiment, one or more zones located below the substrate 506 may be activated at the loading station 510 to keep the substrate 506 in place on the stage 504. In one embodiment, the rotary table is then configured to rotate the stage 504 and substrate 506 to the layer formation station 512.

The layer formation station 512 is configured to form a substantially opaque layer 508 over the substrate 506. According to an embodiment, the substantially opaque layer 508 at least partially covers edges of the substrate 506. In one embodiment where the stage 504 has multiple vacuum zones, zones below the areas of the substantially opaque layer 508 that extend beyond the substrate may be activated after formation of the substantially opaque layer 508. Activating additional vacuum zones below such areas can hold the substantially opaque layer 508 in place on the stage 504. As discussed above, in one embodiment, the substantially opaque layer 508 is a metal layer (e.g., a metal sheet).

The layer formation station 512 is further configured to fit-up the substantially opaque layer 508 to the substrate 506. In one embodiment, the layer formation station 512 is configured fit-up the substantially opaque layer 508 by applying pressure to the substantially opaque layer 508. Fit-up can result in movement of the substrate 506 relative to the stage 504. Therefore, in one embodiment, after performing fit-up of the substantially opaque layer 508 to the substrate 506, the system performs alignment. Alignment performed after fit-up may be performed at the layer formation station 512 and/or at a subsequent processing station. In one embodiment, rotating the substrate from one station to another may result in shifting of the substrate. Therefore, in one such embodiment, alignment is performed after translation to the subsequent processing station (e.g., after rotation to the laser welding station 514).

According to an embodiment, the system includes one or more light sources and one or more images sensors located below the rotary table 502. The light source(s) and image sensor(s) may also be located below the translational mechanisms of the rotary table 502. According to an embodiment, the light source(s) and image sensor(s) do not move with the stage 504 and/or translational mechanism. Instead, in one embodiment, the light source(s) and image sensor(s) are stationary relative to the rotary table 502.

The light source(s) and image sensor(s) may be located at a single station, or more than one station. For example, in one embodiment, the layer formation station 512, the laser station 514, and/or the patterning and trimming station 516 include light source(s) and image sensor(s) for alignment. As discussed above with respect to FIGS. 3A and 3B, different configurations of light sources and image sensors are possible at a given processing station. In embodiments where more than one station includes light sources and image sensors for alignment, the stations may include the same or different configurations. For example, one processing station may require more precise alignment than another, and therefore may include a greater number of imaging sensors, light source providing greater illumination, higher resolution image sensors, and/or a different type of illumination and image sensor than a processing station requiring lower precision.

The light source(s) are configured to illuminate the covered edges of the substrate through the stage. The image sensor(s) are configured to capture an image of the covered edges of the substrate 506 based on the light transmitted through the stage 504. Embodiments may further include a mechanism capable of protecting the image sensor from processing. For example, the system may include a half-silvered mirror or a shutter disposed between the stage 504 and the image sensor located below the table to protect the image sensors from laser processing, as illustrated in FIG. 2D. In an embodiment including a shutter, the shutter may be configured to be in an open position when the image sensor is capturing an image of the covered edges of the substrate, and in a closed position during processing of the substrate. In an embodiment with a half-silvered mirror, the half-silvered mirror has a stationary position and/or configuration with respect to an image sensor, the rotary table, and/or the stage 504. Some embodiments may not include mechanisms for protecting the image sensors. For example, the laser welding station 514 may involve laser processing with a laser that does not reach the image sensors, therefore eliminating the benefits of such protective mechanisms. In another example, the loading station 510 generally does not involve processing that can damage the image sensors, and therefore may not include protection mechanisms such as shutters or half-silvered mirrors.

The example system also includes a computing device configured to determine a position of the substrate 506 relative to the stage 504 based on the image(s) of the covered edges. The computing device may include one or more of the components of the data processing system 600 of FIG. 6 described below. The position of the substrate 506 may then be used to adjust elements of the system, as described herein, to account for any movement of the substrate 506 relative to the stage 504. For example, in one embodiment, a computing device may receive (e.g., from an image sensor) a first image of first at least partially covered edges of the substrate 506, wherein the first image includes the first at least partially covered edges illuminated from light transmitted through the stage 504 supporting the substrate 506. The computing device may then determine a position of the substrate 506 relative to the stage 504 based on the first image of the first at least partially covered edges. Based on the position, the computing device may then provide an instruction to a processing station (e.g., one of the processing stations 510, 512, 514, and/or 516), wherein the instruction is usable by the processing station to process the substrate. For example, the computing device may provide an instruction to the laser station 514 to adjust the position, wavelength, duration, and/or power of laser(s) at the laser station 514 and/or the position of the stage 504 for laser processing.

According to one embodiment, the computing device may also receive (e.g., from the same or a different image sensor) a second image of second at least partially covered edges of the substrate, wherein the second image includes the second at least partially covered edges illuminated from light transmitted through the stage. In one such embodiment, the computing device determines the position of the substrate 506 based further on the second image of the second at least partially covered edges. In one such embodiment, the first and second at least partially covered edges are different in at least one respect.

The system may include one or more additional processing stations. The additional processing stations may be configured to process the substrate 506 based on the determined position of the substrate 506 under the substantially opaque layer 508. For example, the system may include laser processing stations to process the substantially opaque layer 508 and/or the substrate 506. The embodiment illustrated in FIG. 5 includes a laser station 514 and a patterning and trimming station 516.

According to an embodiment, the laser station 514 is configured to weld the first and second metal layers. For example, in an embodiment where the substantially opaque layer 508 is a second metal layer placed over a first metal layer of the substrate 506, the laser station 514 is configured to weld the first and second metal layers. The system may also (or alternatively) perform alignment after laser welding at the laser station 514.

The patterning and trimming station 516 is configured to pattern the substantially opaque layer 508 and/or the substrate 506. The patterning and trimming station 516 may further be configured to trim the substantially opaque layer 508. For example, if the substantially opaque layer 508 is a metal plate that extends beyond the edges of the substrate 506, the areas of the metal plate beyond the edges of the substrate 506 may be trimmed after performing fit-up. In an embodiment where the stage 504 has multiple vacuum zones, zones located below areas of the substantially opaque layer 508 that extend beyond the substrate 506 may be deactivated during a trimming operation to remove the trimmed areas of the substantially opaque layer 508. The system may also (or alternatively) perform alignment after patterning and/or trimming at the patterning and trimming station 516.

In one embodiment, the laser processing, patterning, and/or trimming may be performed at a single station, such as laser station 514. In one such embodiment, the same laser can be configured to perform the welding, patterning, and/or trimming. For example, the laser can be configured with a first set of parameters (e.g., power, wavelength, duration, shape, etc.) to perform the welding and configured with another set or sets of parameters to perform the patterning and/or trimming. After patterning and trimming, the system may return the substrate to the loading station to unload the substrate 506 from the stage 504. Prior to unloading the substrate 506, the system may perform alignment at the loading station 510, or at the previous processing station (e.g., the patterning and trimming station 516). Performing alignment prior to unloading the substrate 506 can reduce the occurrence of damage to the substrate 506 caused by misaligned transport components. A new substrate can then be loaded onto the stage 504 for processing.

Figure 6:
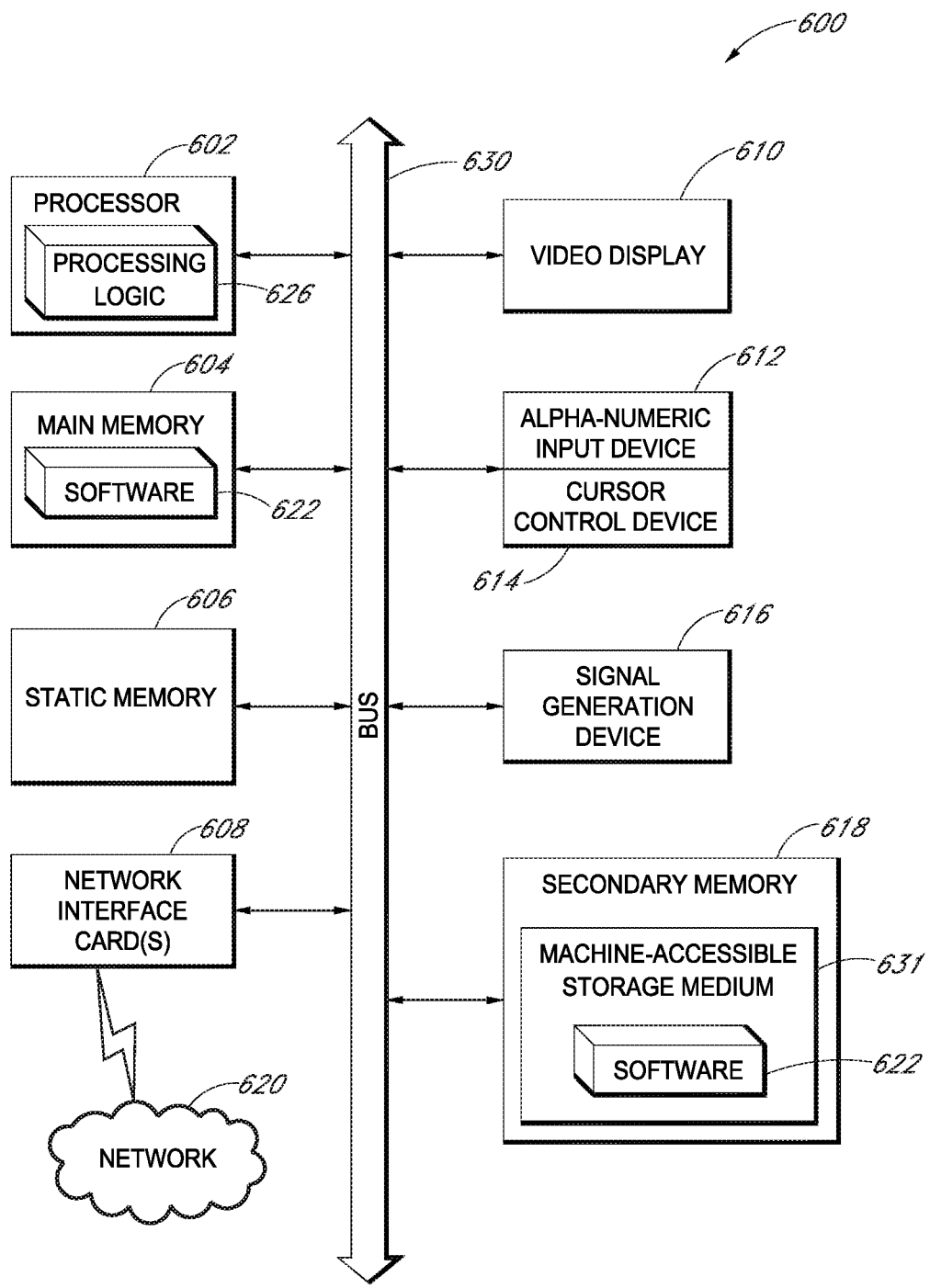
FIG. 6 illustrates a data processing system that may store and execute a set of instructions to perform methods discussed herein, in accordance with an embodiment of the present disclosure.

FIG. 6 illustrates a data processing system (e.g., computer system) that may be configured to store and execute a set of instructions to perform the disclosed techniques, in accordance with an embodiment of the present disclosure. The exemplary data processing system 600 includes one or more processor(s) 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, etc. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The data processing system 600 may further include a network interface device 608. The data processing system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the data processing system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure.

For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Thus, alignment methods and systems for photovoltaic wafers with restricted visual access have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A non-transitory machine-accessible storage medium storing instructions executable by a computing device to perform:
    supporting a substrate over a stage;
    forming a substantially opaque layer over the substrate, the substantially opaque layer at least partially covering edges of the substrate, wherein forming the substantially opaque layer over the substrate comprises placing a metal sheet over the substrate;
    performing fit-up of the substantially opaque layer to the substrate, wherein the substantially opaque layer extends beyond the edges of the substrate outside of a perimeter of the substrate following the fit-up, wherein performing fit-up comprises applying pressure to the metal sheet;
    illuminating the at least partially covered edges of the substrate with light transmitted through the stage;
    capturing a first image of the at least partially covered edges of the substrate based on the light transmitted through the stage;
    determining a first position of the substrate relative to the stage based on the first image of the at least partially covered edges;
    processing the substrate based on the determined first position of the substrate under the substantially opaque layer, wherein processing the substrate based on the determined first position comprises applying a laser to at least the metal sheet or a metal layer of the substrate;
    capturing a second image of the at least partially covered edges of the substrate after said applying the laser; and
    determining a second position of the substrate relative to the stage based on the second image of the at least partially covered edges.

2. The non-transitory machine-accessible storage medium of claim 1, wherein capturing the first image of the at least partially covered edges of the substrate comprises capturing the first image through one or more substantially transparent windows in the stage.

3. The non-transitory machine-accessible storage medium of claim 1, wherein capturing the first image of the at least partially covered edges of the substrate comprises capturing the first image through the stage.

4. The non-transitory machine-accessible storage medium of claim 1, wherein capturing the first image of the at least partially covered edges comprises capturing the first image with an image sensor located below the stage.

5. The non-transitory machine-accessible storage medium of claim 1, wherein illuminating the at least partially covered edges of the substrate with light transmitted through the stage comprises illuminating with dark field illumination.

6. The non-transitory machine-accessible storage medium of claim 1, wherein illuminating the at least partially covered edges of the substrate comprises illuminating the at least partially covered edges with one or more light sources located in the stage.

7. The non-transitory machine-accessible storage medium of claim 1, wherein illuminating the at least partially covered edges of the substrate comprises illuminating the at least partially covered edges with one or more light sources located below the stage.

8. The non-transitory machine-accessible storage medium of claim 1, wherein capturing the first image comprises capturing an image of each of the at least partially covered edges of the substrate.

9. The non-transitory machine-accessible storage medium of claim 1, wherein capturing the first image comprises capturing an image of each of a plurality of corners of the substrate.

10. A non-transitory machine-accessible storage medium storing instructions executable by a computing device to perform:
    supporting a substrate over a stage;
    forming a substantially opaque layer over the substrate, the substantially opaque layer at least partially covering edges of the substrate, wherein forming the substantially opaque layer over the substrate comprises placing a metal sheet over the substrate;
    performing fit-up of the substantially opaque layer to the substrate, wherein the substantially opaque layer extends beyond the edges of the substrate outside of a perimeter of the substrate following the fit-up, wherein performing fit-up comprises applying pressure to the metal sheet;
    illuminating the at least partially covered edges of the substrate with light transmitted through the stage;
    capturing a first image of the at least partially covered edges of the substrate based on the light transmitted through the stage;
    determining a first position of the substrate relative to the stage based on the first image of the at least partially covered edges;
    processing the substrate based on the determined first position of the substrate under the substantially opaque layer, wherein processing the substrate based on the determined first position comprises applying a laser to at least the metal sheet or a metal layer of the substrate;
    patterning the metal sheet;
    capturing a second image of the at least partially covered edges of the substrate after patterning the metal sheet;
    determining a second position of the substrate relative to the stage based on the second captured image of the at least partially covered edges; and
    trimming the patterned metal sheet.

11. The non-transitory machine-accessible storage medium of claim 10, wherein capturing the first image of the at least partially covered edges of the substrate comprises capturing the first image through one or more substantially transparent windows in the stage.

12. The non-transitory machine-accessible storage medium of claim 10, wherein capturing the first image of the at least partially covered edges of the substrate comprises capturing the first image through the stage.

13. The non-transitory machine-accessible storage medium of claim 10, wherein capturing the first image of the at least partially covered edges comprises capturing the first image with an image sensor located below the stage.

* * * * *